United States Patent
Offermann

(10) Patent No.: US 9,958,292 B1
(45) Date of Patent: May 1, 2018

(54) SENSOR PACKAGE WITH DOUBLE-SIDED CAPACITOR ATTACH ON SAME LEADS AND METHOD OF FABRICATION

(71) Applicant: NXP B.V., Eindhoven (NL)

(72) Inventor: Bernd Offermann, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days. days.

(21) Appl. No.: 15/334,063

(22) Filed: Oct. 25, 2016

(51) Int. Cl.
  *G01D 5/14* (2006.01)
  *H01L 23/495* (2006.01)
  *H01L 49/02* (2006.01)
  *H01L 21/56* (2006.01)

(52) U.S. Cl.
  CPC .......... *G01D 5/14* (2013.01); *H01L 21/56* (2013.01); *H01L 23/49575* (2013.01); *H01L 28/40* (2013.01)

(58) Field of Classification Search
  CPC ..... G01D 5/14; H01L 21/56; H01L 23/49575; H01L 28/40; H01L 2224/48091; H01L 2224/48247; H01L 2924/14; H01L 2924/19041; H01L 23/49589
  See application file for complete search history.

(56) References Cited

U.S. PATENT DOCUMENTS

| 7,378,721 B2 | 5/2008 | Frazee et al. |
| 7,615,994 B2 | 11/2009 | Butzmann |
| 2002/0175678 A1 | 11/2002 | Butzmann |
| 2008/0013298 A1* | 1/2008 | Sharma ............... G01D 11/245 361/813 |
| 2011/0175598 A1 | 7/2011 | Doering et al. |
| 2012/0112742 A1 | 5/2012 | Schrader |
| 2013/0249027 A1 | 9/2013 | Taylor et al. |
| 2013/0249029 A1 | 9/2013 | Vig et al. |
| 2013/0249544 A1* | 9/2013 | Vig .................... G01R 33/0011 324/252 |
| 2013/0249546 A1 | 9/2013 | David et al. |

(Continued)

FOREIGN PATENT DOCUMENTS

WO    WO-99/67651 A1    12/1999

OTHER PUBLICATIONS

European application No. 15190025.5, not yet published; 16 pages (Oct. 15, 2015).

(Continued)

*Primary Examiner* — Latanya N Crawford
(74) *Attorney, Agent, or Firm* — Charlene R. Jacobsen

(57) ABSTRACT

A sensor package includes a lead frame, a sensor component, and first and second capacitors. The lead frame has a sensor mounting area and first and second leads. The sensor mounting area, the first lead, and the second lead are characterized by a first side and a second side. The sensor component is attached to the first side of the sensor mounting area of the lead frame. The first capacitor is interconnected between the first and second leads, with the first capacitor being attached to the first side of each of the leads. The second capacitor is interconnected between the first and second leads, with the second capacitor being attached to the second side of each of the leads. The first and second capacitors are arranged in stacked relation with one another on opposing sides of the leads, and the sensor component and capacitors are located in a single housing.

17 Claims, 5 Drawing Sheets

(56) References Cited

U.S. PATENT DOCUMENTS

| | | | |
|---|---|---|---|
| 2013/0285167 A1* | 10/2013 | Otte | G01L 19/0069 |
| | | | 257/415 |
| 2016/0169763 A1* | 6/2016 | Vaupel | G01L 19/147 |
| | | | 73/753 |
| 2017/0108353 A1* | 4/2017 | Offermann | G01D 5/14 |
| 2017/0278981 A1* | 9/2017 | Vig | G01R 33/0047 |

OTHER PUBLICATIONS

Infineon; "TLE4924CB—Product Brief"; 2 pages (Dec. 2012).

Micronas; "Micronas presents smallest integrated capacity EMC-proof linear Hall sensor"; retrieved from the Internet www.micronas.com on Oct. 17, 2016); 2 pages (Oct. 23, 2014).

NXP; "NXP Magnetoresistive sensors KMA2xx Series"; 4 pages (2011).

* cited by examiner

SENSOR PACKAGE WITH DOUBLE-SIDED CAPACITOR ATTACH ON SAME LEADS AND METHOD OF FABRICATION

TECHNICAL FIELD OF THE INVENTION

The present invention relates generally to sensor packages. More specifically, the present invention relates to a sensor package with a double-sided capacitor attach configuration on the same leads.

BACKGROUND OF THE INVENTION

Magnetic sensor systems are increasingly important in a variety of industries. For example, accurate rotational speed measurement is a vital component in maintaining performance, safety, and reliability in modern vehicles. It forms the basis of numerous applications from anti-lock braking to engine management systems, and provides means for embedding intelligence throughout a vehicle via advanced networks and control systems. Accordingly, modern vehicles are increasingly being equipped with magnetic sensors to monitor the speed of a crankshaft or camshaft, to monitor a rotation speed of a wheel about a wheel axis in an anti-lock braking system (ABS), and so forth. Such magnetic sensors (also referred to as speed sensors, angular sensors, and/or rotational sensors) may help increase vehicle stability, reduce vehicle emissions, and enable drive-independent control functions.

In general, a magnetic speed sensor is configured to sense the motion of a magnetic encoder gear wheel or a magnetized target. A periodic magnetic field stemming from the effect of flux bending by the magnetic gear wheel or directly from the magnetized target is transformed by the magnetic speed sensor into an analog electrical signal. The frequency of the signal is proportional to the rotational speed of the target. Different sensor applications may have different restrictions regarding the size and shape of a sensor package in order to allow the sensor to be mounted as close as necessary to a target to be measured. Additionally, among other design and performance considerations, such magnetic speed sensors are typically required to fulfill electromagnetic compatibility (EMC) and electrostatic discharge (ESD) performance requirements.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns magnetic sensor packages and methodology for fabricating such sensor packages. More particularly, a sensor package has a double-sided capacitor attach configuration on the same leads to fulfill electromagnetic compatibility (EMC) and electrostatic discharge (ESD) performance requirements while concurrently meeting size and shape constraints, and enabling usage in "folded applications."

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements from one another.

Figure 1:
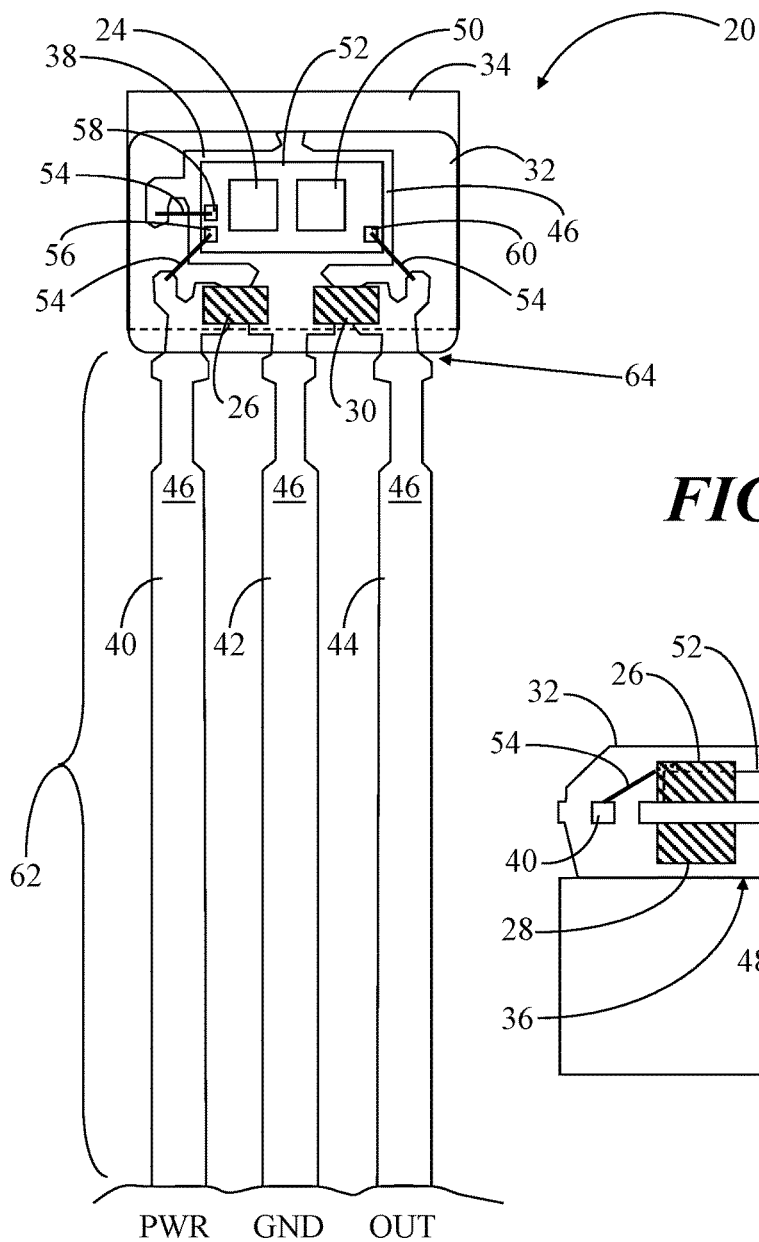
FIG. 1 shows a front view of a sensor package in accordance with an embodiment.
Figure 2:
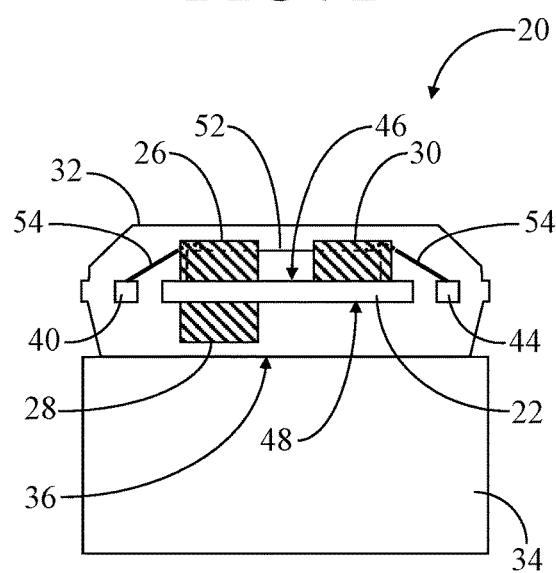
FIG. 2 shows a side view of the sensor package of FIG. 1.

Referring to FIGS. 1 and 2, FIG. 1 shows a front view of a sensor package 20 in accordance with an embodiment and FIG. 2 shows a side view of sensor package 20. In some embodiments, sensor package 20 may be a speed sensor package for providing rotational speed measurement. Sensor package 20 includes a lead frame 22, a sensor component 24, a first capacitor 26, a second capacitor 28 (visible in FIG. 2), and a third capacitor 30 located within a housing 32. In some embodiments, a magnetic element 34 may be attached to an exterior surface 36 of housing 32.

In this example, lead frame 22 includes a sensor mounting area 38, a first lead 40, a second lead 42, and a third lead 44. Lead frame 22 (including sensor mounting area 38, first lead 40, second lead 42, and third lead 44) is characterized by a first side 46 and a second side 48 (visible in FIG. 2), with second side 48 being parallel and opposite to first side 46. Sensor component 24 is attached to first side 46 of sensor mounting area 38. Additionally, first capacitor 26 is interconnected between first and second leads 40, 42, with first capacitor 26 being attached to first side 46 of each of first and second leads 40, 42. Similarly, third capacitor 30 may be interconnected between second and third leads 42, 44, with third capacitor 30 being attached to first side 46 of each of second and third leads 42, 44. Conversely, second capacitor 28 is interconnected between first and second leads 40, 42, with second capacitor 28 being attached to second side 48 (visible in FIG. 2) of each of first and second leads 40, 42.

Sensor package 20 may further include signal processing circuitry 50 associated with sensor component 24. In the illustrated embodiment, sensor component 24 and signal processing circuitry 50 may be combined as an integrated circuit (IC) die 52, with IC die 52 being attached to first side 46 of sensor mounting area 38. In FIG. 1, IC die 52 includes adjacent blocks representing sensor component 24 and signal processing circuitry 50 for simplicity of illustration. However, in an example configuration, sensor component 24 may be a magnetic sensor, such as a magnetoresistive sensor. The magnetoresistive sensor may be formed of metal layers on top of signal processing circuitry 50 and may be connected to signal processing circuitry 50 by, for example, vias.

Sensor package 20 may additionally include multiple bond wires 54 interconnected between lead frame 22 and IC die 52. For example, one of bond wires 54 may be coupled to a first terminal element 56 of IC die 52 and to first lead 40. It should be observed that second lead 42 is directly connected to sensor mounting area 38. Thus, another bond wire 54 may be coupled to a second terminal element 58 of IC die 52 and to second lead 42 via sensor mounting area 38. Yet another bond wire 54 may be coupled to a third terminal element 60 of IC die 52 and to third lead 44.

Housing 32 may be formed from injection-molded epoxy molding compound that fully encapsulates sensor mounting area 38 of lead frame 22, IC die 52, bond wires 54, first, second, and third capacitors 26, 28, 30, and the distal portions of first, second, and third leads 44, 46, 48 at which first, second, and third capacitors 26, 28, 30 are located. Elongated portions 62 of first, second, and third leads 40, 42, 44 extend outside of housing 32. Further, first, second, and third capacitors 26, 28, 30 on first, second, and third leads 40, 42, 44 are proximate, or close to, an entrance location 64 of first, second, and third leads 40, 42, 44 into housing 32.

In an embodiment, first lead 40 is configured to provide power (PWR) to sensor component 24 and signal processing circuitry 50 of IC die 52 via first terminal 56. Second lead 42 is configured to be coupled to ground (GND), and third lead 44 is configured to provide an output signal (OUT) from sensor component 24 of IC die 52.

As particularly shown in FIG. 2, first and second capacitors 26, 28 are in stacked relation with one another at first and second sides 46, 48 of first and second leads 40, 42. That is, first and second capacitors 26, 28 are generally aligned with one another in a double-sided capacitor attach configuration in which the capacitors are placed on both sides of first and second leads 40, 42. However, another capacitor is not interconnected between second and third leads 42, 44 at second side 48 of second and third leads 42, 44.

For magnetic sensors, such as sensor package 20, electronic protection elements may be called for in order to fulfill EMC performance requirements, ESD protection, and/or for bridging small interruptions of the power. Capacitors are sometimes implemented in magnetic sensors to serve these functions. Increasingly, system-in-package (SiP) configurations are being utilized to enable a complete functional unit while meeting compact size requirements. Thus, sensor component 24 and signal processing circuitry 50 may be integrated into a single IC die 52 to meet stringent size requirements. Further, IC die 52 and first, second, and third capacitors 26, 28, 30 may be integrated into a single housing 32 to further minimize size while fulfilling EMC/ESD performance requirements and/or for bridging small interruptions of the power.

Some capacitance requirements, especially on the input (i.e., first lead 40) are relatively high to protect sensor package 20 and reduce EMC emission. Indeed, better protection may be provided with greater capacitance. Unfortunately, attachment of large capacitors to the same side of a lead frame as the IC die can be problematic. That is, if the thickness of the capacitors is significantly larger than the thickness of the IC die, the resulting thickness of the side of the molded housing of the sensor package facing a magnetic encoder gear wheel may be undesirably big. A large thickness of the side of the molded housing facing a magnetic encoder gear wheel, effectively decreases the width of the airgap between the magnetic sense element and the magnetic gear wheel. The amount of plastic molding material can have a significant adverse impact on product performance. Accordingly, the thickness of the plastic molded housing between a sensor element and the magnetic gear wheel should be as small as possible. The limited thickness of the plastic molded housing limits the allowed size of the capacitor, and with that, its capacity.

The stacked arrangement of first and second capacitors 26, 28 on opposing first and second sides 46, 48 of first and second leads 40, 42 enables the implementation of physically smaller capacitors while still providing sufficiently high capacitance. By way of example, if each of first and second capacitors 26, 28 has a capacitance of one hundred nanofarads (nF), then the combination of both of first and second capacitors 26, 28 provides two hundred nanofarads of capacitance between first and second leads 40, 42. Additionally, this capacitance can be provided without implementing a capacitor compartment separate from housing 32 that might otherwise hamper folded and/or miniaturization designs. Accordingly, a separate capacitor compartment can be absent from sensor package 20.

As mentioned above, another capacitor may not be not present at second side 48 of lead frame 22 and interconnecting second and third leads 42, 44 (FIG. 1). Third lead 44 provides the output signal as a series of output pulses. The capacitance of third capacitor 30 (FIG. 1) may be kept substantially smaller than the combined capacitances of first and second capacitors 26, 28 so as to prevent undesired smoothing of the output pulses.

Figure 3:
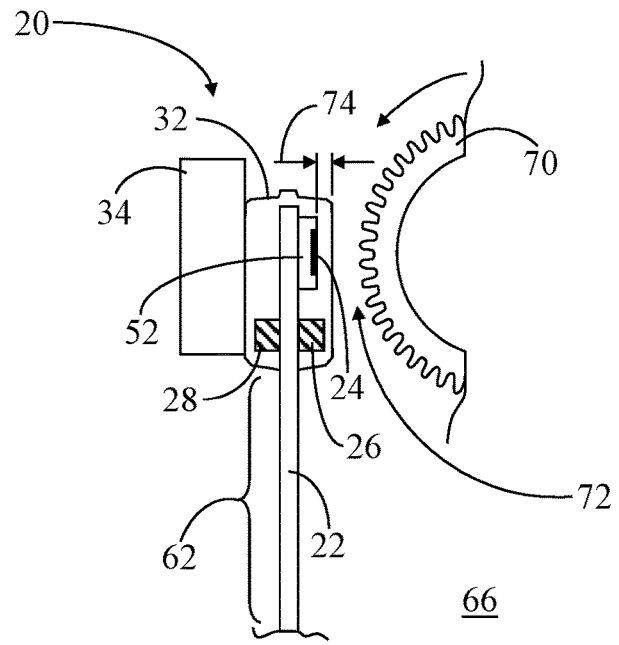
FIG. 3 shows a side view of the sensor package of FIG. 1 in a straight sensing configuration.
Figure 4:
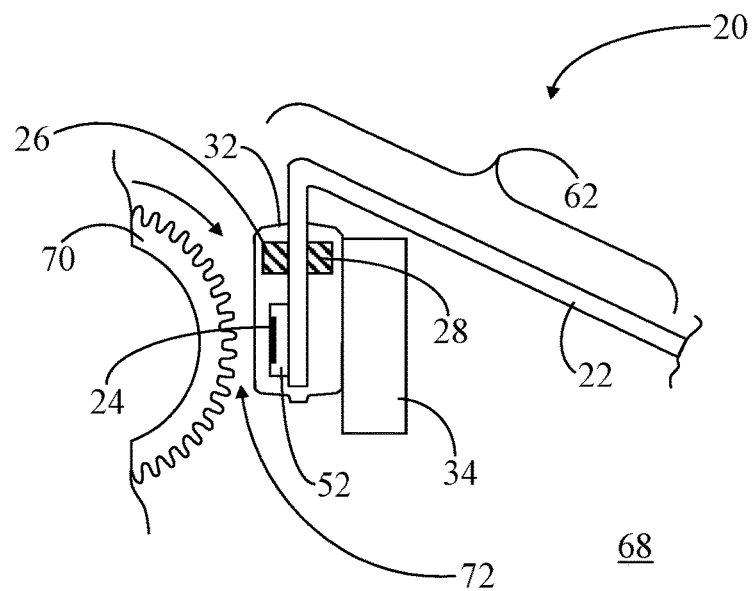
FIG. 4 shows a side view of the sensor package of FIG. 1 in a folded sensing configuration.

Referring now to FIGS. 3 and 4, FIG. 3 shows a side view of sensor package 20 of in a straight sensing configuration 66, and FIG. 4 shows a side view of sensor package 20 in a folded sensing configuration 68. There are various applications in the market for speed sensors and angular sensors. Some applications utilize a straight sensing configuration and some applications utilize a folded sensing configuration depending upon how the sensor element is to be located relative to the magnetic target.

In straight sensing configuration 66 of FIG. 3, elongated portions 62 of leads 40, 42, 44 (FIG. 1) of lead frame 22 are left in an unfolded or straight configuration. Further, IC die 52 faces a magnetic encoder gear wheel 70 with sensor component 24 being separated from gear wheel 70 by an airgap 72 and a thickness 74 of the molding compound of housing 32. Magnetic element 34 on exterior surface 36 of housing 32 is positioned such that lead frame 22 is interposed between magnetic element and sensor component 24. In this example arrangement, as gear wheel 70 rotates, the teeth of gear wheel 70 produces periodically recurrent areas that alternately influence a measuring field which is formed by the magnetic field of magnet element 34. Accordingly, an output signal of sensor component 24 may be a series of output pulses that can be suitably processed by signal processing circuitry 50 (FIG. 1) to yield a speed signal indicative of the movement of gear wheel 70 relative to sensor component 24.

In folded sensing configuration 68 of FIG. 4, elongated portions 62 of leads 40, 42, 44 of lead frame 22 are of a length sufficient to be folded or bent into in folded sensing configuration. Thus, folded sensing configuration 68 shown in FIG. 4 may be implemented in applications having particular size constraints while still enabling the sensing capability described above in connection with FIG. 3. Accordingly, the double-sided capacitor attach configuration of sensor package 20 enables the same sensor package 20 to be utilized in either of straight or folded sensing configurations 66, 68 without the added complexity of a separate capacitor compartment.

The straight and folded sensing configurations 66, 68 of FIGS. 3 and 4 show sensor package 20 with magnetic element 34 attached to exterior surface 36 of housing 32 for illustrative purposes. However, alternative embodiments need not include magnetic element 34. For example, when a magnetized target is utilized in lieu of gear wheel 70, magnetic element 34 would not be required. Thus, a sensor package that implements a magnetized target configuration may include the double-sided capacitor attach configuration, like that of sensor package 20, but would not have magnetic element 34. In an angular magnetic sensor, the sensor response is not speed, but is an angular position, e.g., the position of a valve throttle. An angular magnetic sensor typically utilizes a rotating disk magnet proximate the magnetic sensor in lieu of gear wheel 70. Thus, an angular magnetic sensor would not include magnetic element 34. However, in an angular magnetic sensor, the double-side attach configuration, like that of sensor package 20, may be instrumental in meeting miniaturization and/or increased performance requirements.

Figure 5:
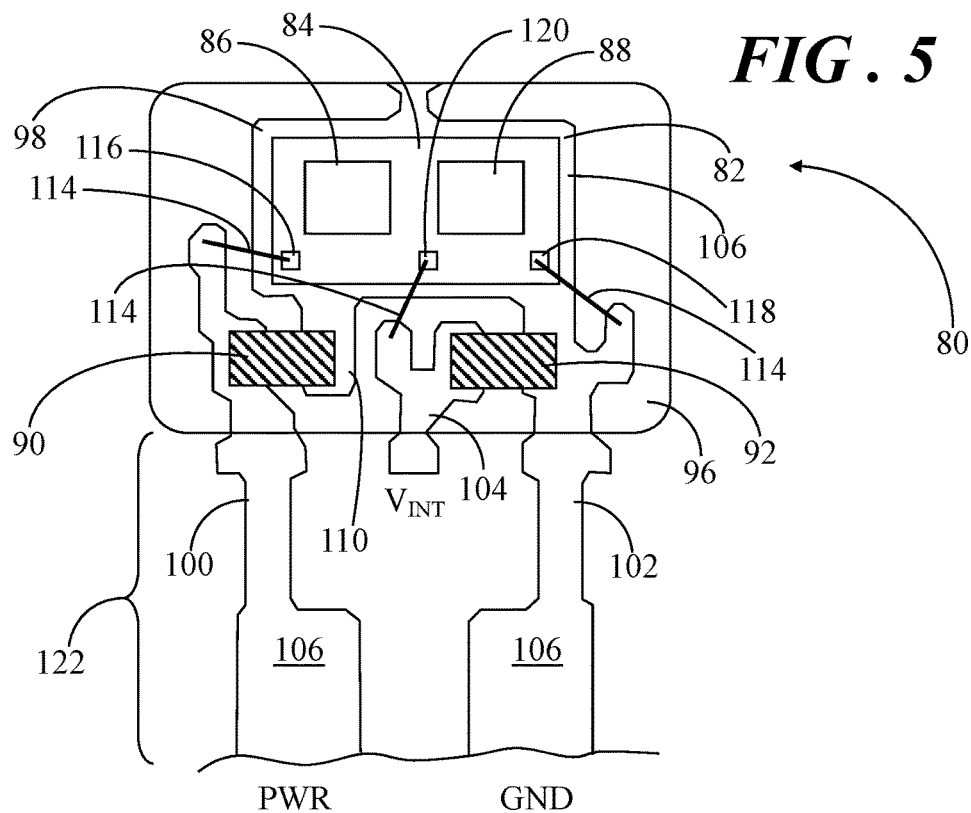
FIG. 5 shows a front view of a sensor package in accordance with another embodiment.
Figure 6:
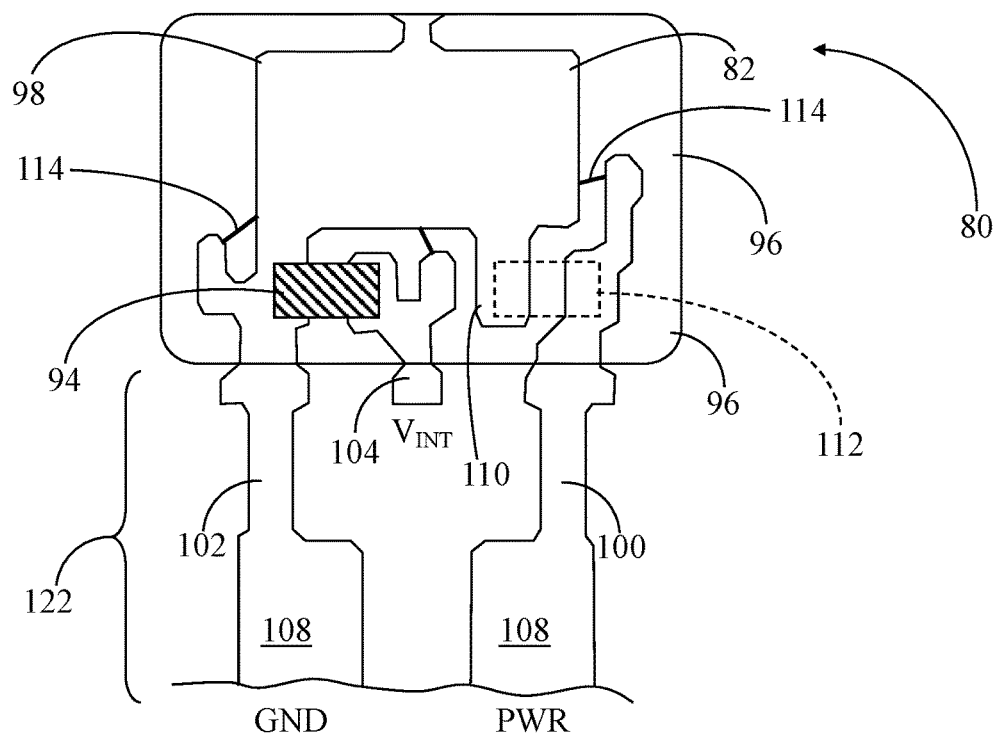
FIG. 6 shows a rear view of the sensor package of FIG. 5.

Referring to FIGS. 5 and 6, FIG. 5 shows a front view of a sensor package 80 in accordance with another embodiment and FIG. 6 shows a rear view of sensor package 80. Sensor package 80 is provided to illustrate a two lead configuration. Sensor package 80 includes a lead frame 82, an IC die 84 combining a sensor component 86 and signal processing circuitry 88, a first capacitor 90, a second capacitor 92, and a third capacitor 94 (visible in FIG. 6) located within a housing 96. A magnetic element is not shown for simplicity of illustration. However, a magnetic element, such as magnetic element 34 (FIG. 2) may be attached to an exterior surface (i.e., the back side) of housing 96.

In this example, lead frame 82 includes a sensor mounting area 98, a first lead 100, a second lead 102, and a center pin 104 positioned between first and second leads 100, 102. Lead frame 82 (including sensor mounting area 98, first lead 100, second lead 102, and center pin 104) is characterized by a first side 106 and a second side 108, with second side 108 being parallel and opposite to first side 106. As shown, second lead 102 is physically connected to (i.e., extends from) sensor mounting area 98 and sensor mounting area 98 includes an extension region 110 located adjacent to first lead 100.

IC die 84 is attached to first side 106 of sensor mounting area 98. Additionally, first capacitor 90 is electrically interconnected between first and second leads 100, 102 at first side 106 via extension region 110 and sensor mounting area 98. Second capacitor 92 is electrically interconnected between second lead 102 and center pin 104 at first side 106 of each of second lead 102 and center pin 104. Further, third capacitor 94 is electrically interconnected between second lead 102 and center pin 104 at second side 108 of each of second lead 102 and center pin 104. Thus, second and third capacitors 92, 94 are arranged in stacked relationship on opposing first and second sides 106, 108 of lead frame 82.

In some embodiments, a fourth capacitor 112 may be electrically interconnected between first and second leads 100, 102 at second side 108 via extension region 110 and sensor mounting area 98, as represented by a dashed line rectangle in FIG. 6. Accordingly, first capacitor 90 and fourth capacitor 112 may be arranged in stacked relationship on opposing first and second sides 106, 108 of lead frame 82.

Sensor package 80 may additionally include multiple bond wires 114 interconnected between lead frame 82 and IC die 84. For example, one of bond wires 54 may be coupled to a first terminal element 116 of IC die 84 and to first lead 100. Another bond wire 114 may be coupled to a second terminal element 118 of IC die 84 and to second lead 102. Yet another bond wire 114 may be coupled to a third terminal element 120 of IC die 84 and to center pin 104.

Again, housing 96 may be formed from injection-molded epoxy molding compound that fully encapsulates sensor mounting area 98 of lead frame 82, IC die 84, bond wires 112, first, second, third, and fourth capacitors 90, 92, 94, 112 and the distal portions of first and second leads 100, 102, and center pin 104. Elongated portions 122 of first and second leads 100, 102 extend outside of housing 96.

In an embodiment, first lead 100 is configured to provide power (PWR) to sensor component 86 and signal processing circuitry 88 of IC die 84 via first terminal element 116. Second lead 102 is configured to be coupled to ground (GND). In some embodiments, speed information sensed via sensor component 86 may be encoded in current pulses on the power supply line, i.e., first lead 100. Center pin 104 is not connected to the outside world, but may support second capacitor 92 and third capacitor 94 to stabilize the internal voltage, $V_{INT}$, for bridging small interruptions of the power.

Figure 7:
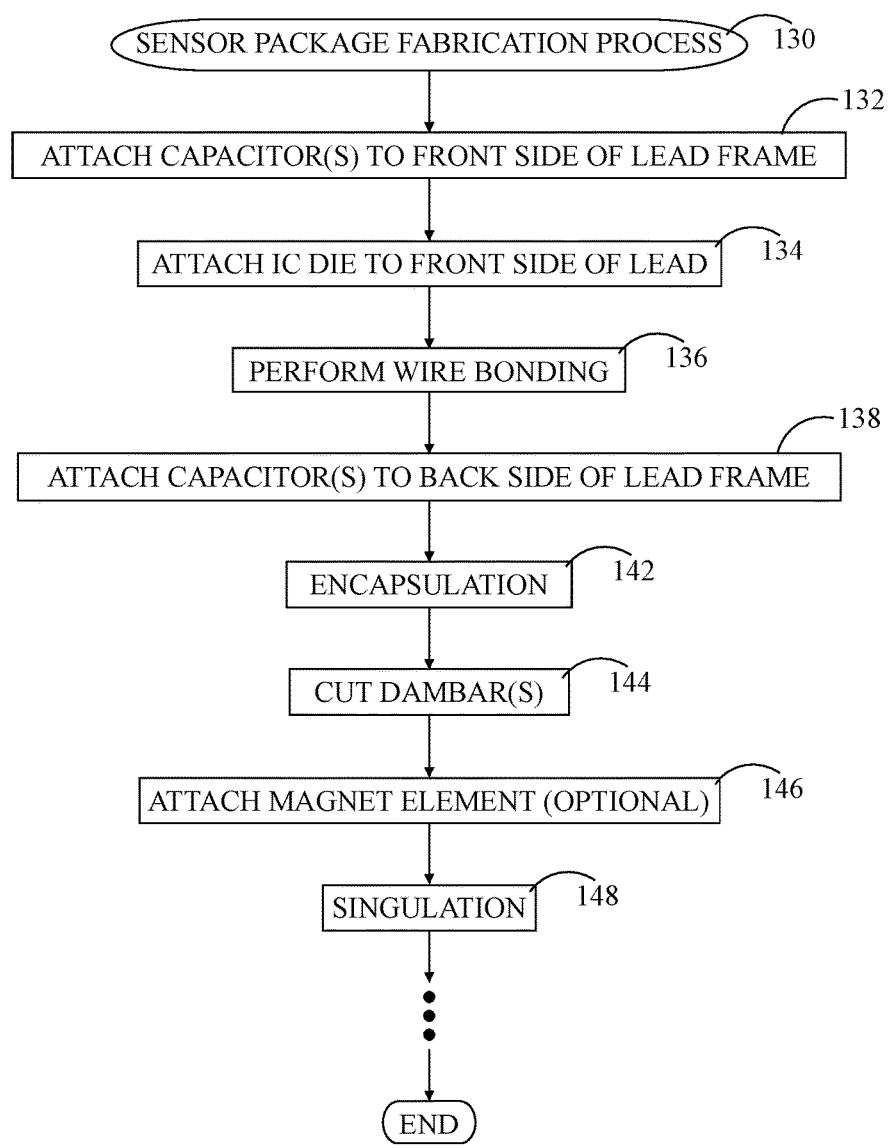
FIG. 7 shows a flowchart of a sensor package fabrication process in accordance with another embodiment.

FIG. 7 shows a flowchart of a sensor package fabrication process 130 in accordance with another embodiment. Sensor package fabrication process 130 may be performed to produce either of sensor package 20 (FIG. 1) or sensor package 80 (FIG. 5). However, although two sensor package configurations were described above, it should be understood that alternative sensor package configurations may be envisioned that include the double-sided capacitor attach structure. As such, sensor package fabrication process 130 may be performed to produce these alternative sensor package configurations. For simplicity of discussion, the following methodology will be described in connection with the fabrication of single sensor package 20. However, those skilled in the art will readily recognize that multiple sensor packages can be fabricated concurrently. FIGS. 1 and 2 should be referred to in conjunction with the following discussion.

At a block 132, first and third capacitors 26, 30 are attached to the front side, i.e., first side 46, of lead frame 22. In particular, first capacitor 26 may be bonded to first side 46 of each of first and second leads 40, 42 using, for example, an electrically conductive adhesive, solder, and the like. Likewise, third capacitor 30 may be bonded to first side 46 of each of second and third leads 42, 44 using, for example, the electrically conductive adhesive, solder, and the like. At a block 134, IC die 52 may be attached to first side 46 of lead frame 22. In particular, IC die 52 may be attached to first side 46 of sensor mounting area 38 using, for example, an electrically insulating adhesive. At a block 136, a wire bonding process may be performed to form bond wires 54. By way of example, a ball-stitch-on-ball bonding method with silver wire may be performed. However, other processes may be performed to form the electrical interconnects between IC die 52 and lead frame 22.

At a block 138, second capacitor 28 is attached to the back side, i.e., second side 48 of lead frame 22. For example, second capacitor 28 may be attached to second side 48 of each of first and second leads 40, 42 in stacked alignment with first capacitor 26 using, for example, an electrically conductive adhesive, solder, and the like.

Figure 8:
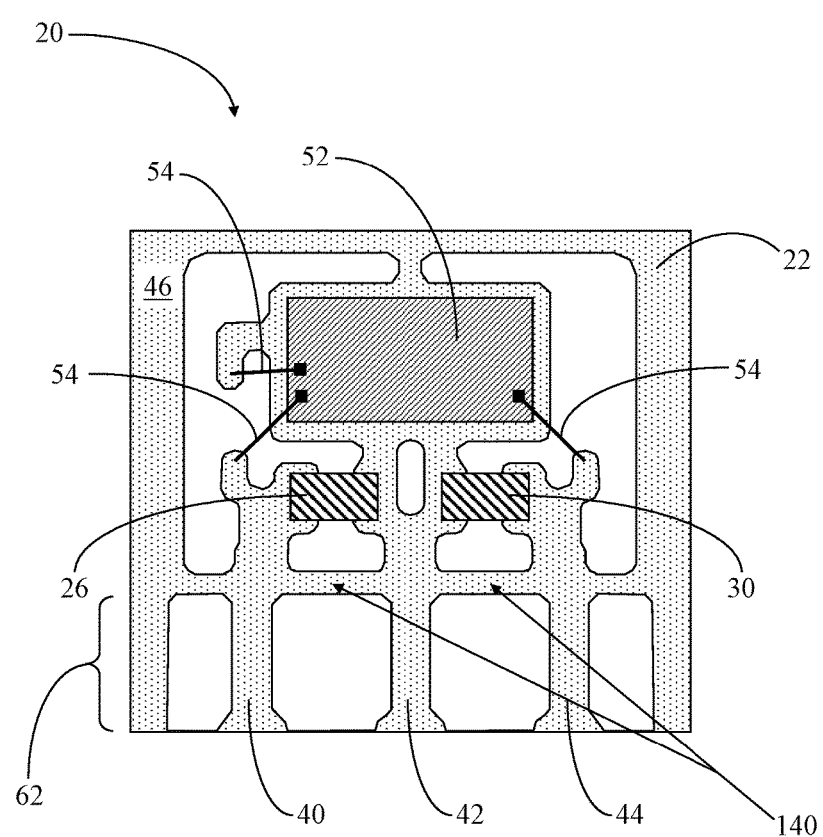
FIG. 8 shows a partial front view of a sensor package at an intermediate stage of fabrication in accordance with the process of FIG. 7.

Referring to FIG. 8 in connection with block 138, FIG. 8 shows a partial front view of sensor package 20 at an intermediate stage of fabrication in accordance with fabrication process 130. During back side (i.e., second side 48) attachment of second capacitor 28, the distal ends of first, second, and third leads 40, 42, 44 may not be fully supported since first and third capacitors 26, 30 are already attached to the front side (i.e., first side 46). In order to limit the risk of tilting or downward bending of first and second leads 40, 42 during attachment, first, second, and third capacitors 26, 28, 30 may be positioned closed to the stabilizing dambar 140. Dambars, typically included on lead frames, are features for plastic molded packages that blocks (i.e., dams) the flow of the plastic molding compound to the external lead area (in this example, elongated portions 62 of first, second, and third leads 40, 42, 44) of the lead frames during molding. Dambars electrically short the leads together and must be removed, i.e., trimmed, before electrically testing the resulting device. Prior to back side attachment of second capacitor 28 in accordance with block 138, lead frame 22 should be clamped on dambar 140 to prevent deformation of lead frame 22 during placement and attachment of second capacitor 28.

Returning to sensor package fabrication process 130, following back side attachment of second capacitor 28, encapsulation is performed at a block 142. At block 142, housing 32 is formed using a molding compound to encapsulate IC die 52, capacitors 26, 28, 30, sensor mounting area 38 and the distal ends of first, second, third leads 40, 42, 44 of lead frame 22, and wire bonds 54. At a block 144, dambars 140 are cut to electrically disconnect leads 40, 42, 44 from one another. At a block 146, for a magnetic sensor package calling for an external magnet, magnet element 34 is attached to exterior surface 36 of housing 32. Thus, block 146 is shown as an optional operation. Thereafter, a singulation block 148 is performed. That is, a plurality of lead frames 22 may be connected to one another and following the aforementioned operations, these lead frames 22 are sawn, diced, or otherwise separated to form a plurality of separate sensor packages 20. Operations following singulation block 148 can include device cleaning, testing, packaging, and so forth that are not described herein for brevity.

Thus, sensor packages having a double-sided attach configuration are disclosed herein. An embodiment of a sensor package comprises a lead frame having a sensor mounting area, a first lead, and a second lead, wherein the sensor mounting area, the first lead, and the second lead are characterized by a first side and a second side, the second side being parallel and opposite to the first side. A sensor component is attached to the first side of the sensor mounting area, a first capacitor is interconnected between the first and second leads, the first capacitor being attached to the first side of each of the first and second leads, and a second capacitor is interconnected between the first and second leads, the second capacitor being attached to the second side of each of the first and second leads.

Another embodiment of a sensor package comprises a lead frame having a sensor mounting area, a first lead, and a second lead, wherein the sensor mounting area, the first lead, and the second lead are characterized by a first side and a second side, the second side being parallel and opposite to the first side. A magnetic sensor component is attached to the first side of the sensor mounting area, a first capacitor interconnected between the first and second leads, the first capacitor being attached to the first side of each of the first and second leads, and a second capacitor is interconnected between the first and second leads, the second capacitor being attached to the second side of each of the first and second leads. The sensor package further includes a single housing in which the magnetic sensor component, the first capacitor, and the second capacitor are located.

An embodiment of a method of forming a sensor package comprises attaching a sensor component to a first side of a sensor mounting area of a lead frame, the lead frame including the sensor mounting area, a first lead, and a second lead, wherein the sensor mounting area, the first lead, and the second lead are characterized by the first side and a second side, the second side being parallel and opposite to the first side. The method further comprises attaching a first capacitor to the first side of each of the first and second leads, the first capacitor being interconnected between the first and second leads, attaching a second capacitor to the second side of each of the first and second leads, the second capacitor being interconnected between the first and second leads, and encapsulating the sensor component, the first capacitor, and the second capacitor in a molding compound to form a single housing in which the sensor component, the first capacitor, and the second capacitor are housed.

The magnetic sensor packages and methodology for fabricating such sensor packages described herein are designed to include a double-sided capacitor attach on the same leads to fulfill electromagnetic compatibility (EMC) and electrostatic discharge (ESD) performance requirements while concurrently meeting size and shape constraints, and enabling usage in "folded applications."

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A sensor package comprising:
   a lead frame having a sensor mounting area, a first lead, and a second lead, wherein said sensor mounting area, said first lead, and said second lead are characterized by a first side and a second side, said second side being parallel and opposite to said first side;
   a sensor component attached to said first side of said sensor mounting area;
   a first capacitor interconnected between said first and second leads, said first capacitor being attached to said first side of each of said first and second leads; and
   a second capacitor interconnected between said first and second leads, said second capacitor being attached to said second side of said each of said first and second leads.

2. The sensor package of claim 1 further comprising signal processing circuitry associated with said sensor component, wherein said sensor component and said signal processing circuitry are combined as an integrated circuit die, and said integrated circuit die is attached to said first side of said sensor mounting area.

3. The sensor package of claim 1 wherein said first lead is configured to provide power to said sensor component and said second lead is configured to be coupled to ground.

4. The sensor package of claim 3 wherein said lead frame further comprises a third lead, said third lead being configured to provide an output signal from said sensor component, and wherein a capacitor is not interconnected between said second and third leads at said second side of each of said second and third leads.

5. The sensor package of claim 1 wherein said first and second capacitors are in stacked relation with one another at said first and second sides of said first and second leads.

6. The sensor package of claim 1 further comprising a single housing in which said sensor component, said first capacitor, and said second capacitor are located.

7. The sensor package of claim 6 wherein said housing is formed from a molding compound.

8. The sensor package of claim 6 wherein said first and second leads extend outside of said housing and said second capacitor is positioned at said second side of said each of said first and second leads proximate an entrance location of said first and second leads into said housing.

9. The sensor package of claim 6 further comprising a magnetic element attached to an exterior surface of said housing, wherein following attachment of said magnetic element to said exterior surface, said lead frame element is interposed between said magnetic element and said sensor component.

10. The sensor package of claim 6 wherein a capacitor compartment that is separate from said housing is absent from said sensor package.

11. The sensor package of claim 6 wherein elongated portions of said first and second leads extend outside of said housing, and said elongated portions are of a length sufficient to be placed in a folded configuration.

12. The sensor package of claim 1 wherein said sensor component comprises a magnetic sensor component.

13. The sensor package of claim 1 wherein said sensor package comprises a speed sensor package.

14. A sensor package comprising:
a lead frame having a sensor mounting area, a first lead, and a second lead, wherein said sensor mounting area, said first lead, and said second lead are characterized by a first side and a second side, said second side being parallel and opposite to said first side;
a magnetic sensor component attached to said first side of said sensor mounting area;
a first capacitor interconnected between said first and second leads, said first capacitor being attached to said first side of each of said first and second leads;
a second capacitor interconnected between said first and second leads, said second capacitor being attached to said second side of said each of said first and second leads; and
a single housing in which said magnetic sensor component, said first capacitor, and said second capacitor are located.

15. The sensor package of claim 14 further comprising signal processing circuitry associated with said magnetic sensor component, wherein said sensor component and said signal processing circuitry are combined as an integrated circuit die, and said integrated circuit die is attached to said first side of said sensor mounting area.

16. The sensor package of claim 14 wherein said first lead is configured to provide power to said magnetic sensor component and said second lead is configured to be coupled to ground, wherein said lead frame further comprises a third lead, said third lead being configured to provide an output signal from said sensor component, and wherein a capacitor is not interconnected between said second and third leads at said second side of each of said second and third leads.

17. The sensor package of claim 14 wherein said first and second capacitors are in stacked relation with one another at said first and second sides of said first and second leads.

* * * * *